United States Patent
Chen et al.

(10) Patent No.: US 11,114,830 B2
(45) Date of Patent: Sep. 7, 2021

(54) NETWORKING ENCLOSURE ASSEMBLY WITH MAGNETIC ALIGNMENT AND INTERLOCKING, ADAPTABLE TO BE INSTALLED IN DIFFERENT LOCATIONS AND POSITIONS

(71) Applicant: PRIMEX MANUFACTURING LTD., Langley (CA)

(72) Inventors: Hong Chen, Richmond (CA); Nathan Cheng, Vancouver (CA); Christian Guckel, Langley (CA); Donovan Hammersley, White Rock (CA); Balin Lee, Port Moody (CA); Kai Zhang, Langley (CA)

(73) Assignee: PRIMEX MANUFACTURING LTD., Langley (CA)

( * ) Notice: Subject to any disclaimer, the term of this patent is extended or adjusted under 35 U.S.C. 154(b) by 457 days.

(21) Appl. No.: 15/956,057

(22) Filed: Apr. 18, 2018

(65) Prior Publication Data

US 2019/0140437 A1 May 9, 2019
US 2020/0227901 A9 Jul. 16, 2020

(30) Foreign Application Priority Data

Nov. 6, 2017 (CA) .............................. CA 2985012

(51) Int. Cl.
*H02G 3/14* (2006.01)
*H05K 5/02* (2006.01)
(Continued)

(52) U.S. Cl.
CPC ............. *H02G 3/14* (2013.01); *H05K 5/0004* (2013.01); *H05K 5/0221* (2013.01); *H02G 3/085* (2013.01)

(58) Field of Classification Search
CPC ........ H02G 3/14; H02G 3/085; H05K 5/0004; H05K 5/0221
(Continued)

(56) References Cited

U.S. PATENT DOCUMENTS

| D130,643 | S | 12/1941 | Hose |
| D182,185 | S | 2/1958 | Hudson |

(Continued)

FOREIGN PATENT DOCUMENTS

| CA | 2385704 A1 | 3/2001 |
| CA | 2417020 C | 4/2011 |

(Continued)

OTHER PUBLICATIONS

Media Distribution Enclosure. (Design—© Questel) orbit.com. [online PDF] 12 pgs. Print Date Jun. 10, 2019 [Retrieved on Nov. 27, 2019] https://sobjprd.questel.fr/export/QPTUJ214/pdf2/d2ce5d1e-4f80-479e-9fc1-81fa402c0832-235620.pdf.

(Continued)

*Primary Examiner* — J. Gregory Pickett
*Assistant Examiner* — Niki M Eloshway

(57) ABSTRACT

It comprises a receptacle subassembly, a lid subassembly telescopically interacting with the receptacle subassembly by partially penetrating into or by retracting from the receptacle subassembly and a magnetic unit attached to the receptacle subassembly and to the lid subassembly and intended to align and interlock the receptacle subassembly with the lid subassembly; the lid subassembly incorporating supplementarily an optionally detachable frame unit, intended to cover an unaesthetic transitional zone between a contour of the enclosure assembly and a wall opening wherein the enclosure assembly is installed.

19 Claims, 20 Drawing Sheets

(51) Int. Cl.
*H05K 5/00* (2006.01)
*H02G 3/08* (2006.01)

(58) Field of Classification Search
USPC .................................................. 220/3.8, 230
See application file for complete search history.

(56) References Cited

U.S. PATENT DOCUMENTS

| | | | |
|---|---|---|---|
| 3,334,770 A | 8/1967 | Stanback | |
| D223,833 S | 6/1972 | Dreyfuss | |
| 3,864,511 A | 2/1975 | Morby | |
| 4,375,863 A * | 3/1983 | Kappler | B65D 43/164 220/230 |
| 4,449,015 A | 5/1984 | Hotchkiss | |
| D274,721 S | 7/1984 | Smith | |
| D307,908 S | 5/1990 | Pushelberg | |
| D312,460 S | 11/1990 | Smith | |
| 5,015,061 A | 5/1991 | Giannini | |
| D325,374 S | 4/1992 | Ashby | |
| D325,569 S | 4/1992 | Buchanan et al. | |
| D327,887 S | 7/1992 | Pushelberg et al. | |
| D335,650 S | 5/1993 | Powell et al. | |
| D335,866 S | 5/1993 | Powell et al. | |
| D337,313 S | 7/1993 | Davis | |
| D339,794 S | 9/1993 | Powell et al. | |
| 5,408,570 A | 4/1995 | Cook et al. | |
| 5,459,808 A | 11/1995 | Keith | |
| 5,490,229 A | 2/1996 | Ghandeharizadeh et al. | |
| 5,497,444 A | 3/1996 | Wheeler | |
| D369,785 S | 5/1996 | Cote | |
| D379,088 S | 5/1997 | Hopper | |
| D399,190 S | 10/1998 | Dale et al. | |
| D401,558 S | 11/1998 | Almond | |
| D401,568 S | 11/1998 | Alden et al. | |
| D402,663 S | 12/1998 | Fechner | |
| D408,015 S | 4/1999 | Faucher | |
| D408,823 S | 4/1999 | Kirby | |
| 5,914,863 A | 6/1999 | Shen | |
| 5,929,379 A | 7/1999 | Reiner | |
| 5,944,210 A | 8/1999 | Yetter | |
| D414,745 S | 10/1999 | Schmitt | |
| 5,996,831 A * | 12/1999 | Teok | E05B 47/004 220/230 |
| 6,076,309 A | 6/2000 | Daoud | |
| 6,116,447 A | 9/2000 | Daoud | |
| D436,926 S | 1/2001 | Lew | |
| 6,172,298 B1 | 1/2001 | Norvelle | |
| 6,184,468 B1 * | 2/2001 | Speziale | H02G 3/14 174/66 |
| D442,922 S | 5/2001 | Sato | |
| D449,824 S | 10/2001 | Higa et al. | |
| D450,665 S | 11/2001 | Isely et al. | |
| D450,667 S | 11/2001 | Scribner | |
| D452,487 S | 12/2001 | Kaplan | |
| 6,359,222 B1 | 3/2002 | Norvelle | |
| D461,779 S | 8/2002 | Hughes | |
| D466,087 S | 11/2002 | Cuny et al. | |
| D468,697 S | 1/2003 | Straub, Jr. | |
| 6,753,471 B2 | 6/2004 | Johnson | |
| D499,069 S | 11/2004 | Stanush et al. | |
| D500,746 S | 1/2005 | Gavel et al. | |
| D526,648 S | 8/2006 | Andre et al. | |
| D566,657 S | 4/2008 | Shen et al. | |
| D568,312 S | 5/2008 | Wang et al. | |
| D583,795 S | 12/2008 | Keenum et al. | |
| D591,688 S | 5/2009 | Nishiyama et al. | |
| D591,690 S | 5/2009 | Vogel et al. | |
| 7,607,430 B2 * | 10/2009 | Davis | H01F 7/0263 128/200.11 |
| D605,139 S | 12/2009 | Moore | |
| 7,667,145 B2 | 2/2010 | Dinh | |
| D634,720 S | 3/2011 | Cheng et al. | |
| D635,106 S | 3/2011 | Cheng et al. | |
| D638,367 S | 5/2011 | Isaacks et al. | |
| 7,991,444 B2 | 8/2011 | Wang | |
| D645,821 S | 9/2011 | Masumoto | |
| D653,662 S | 2/2012 | Park et al. | |
| D660,261 S | 5/2012 | Huang et al. | |
| 8,231,022 B2 | 7/2012 | Goldenne | |
| D675,999 S | 2/2013 | Puskar-Pasewicz | |
| 8,457,464 B2 | 6/2013 | O'Connor | |
| 8,554,043 B2 | 10/2013 | Deel et al. | |
| D702,198 S | 4/2014 | Gretz | |
| D711,834 S | 8/2014 | Jones | |
| 8,816,200 B1 | 8/2014 | Baldwin et al. | |
| D713,799 S | 9/2014 | Buck et al. | |
| D722,032 S | 2/2015 | Chou et al. | |
| D722,975 S | 2/2015 | Debone et al. | |
| D726,295 S | 4/2015 | Kim et al. | |
| D733,066 S | 6/2015 | Vaughn et al. | |
| D738,835 S | 9/2015 | Bush et al. | |
| 9,176,531 B1 | 11/2015 | Hayden | |
| D745,479 S | 12/2015 | McManigal | |
| D745,480 S | 12/2015 | Mathews et al. | |
| D750,031 S | 2/2016 | Lord | |
| D752,529 S | 3/2016 | Loretan et al. | |
| D756,976 S | 5/2016 | Jou et al. | |
| 9,391,437 B2 | 7/2016 | Shimizu et al. | |
| D763,196 S | 8/2016 | DeCosta | |
| D765,140 S | 8/2016 | Peng et al. | |
| 9,470,867 B1 | 10/2016 | James | |
| D773,399 S | 12/2016 | Geiger | |
| D778,241 S | 2/2017 | Holbrook et al. | |
| 9,620,946 B2 | 4/2017 | Baldwin et al. | |
| D791,714 S | 7/2017 | Papakos et al. | |
| D811,348 S | 2/2018 | Cueller et al. | |
| 9,893,502 B2 | 2/2018 | Baldwin et al. | |
| D814,424 S | 4/2018 | DeCosta | |
| D816,624 S | 5/2018 | Odryna et al. | |
| 9,972,887 B1 * | 5/2018 | Feiner | H01Q 1/2291 |
| 10,033,172 B2 | 7/2018 | Baldwin et al. | |
| D835,049 S | 12/2018 | Wilcox et al. | |
| 10,153,113 B2 | 12/2018 | Richardson et al. | |
| D842,727 S | 3/2019 | Pennebaker | |
| 10,270,236 B2 | 4/2019 | Franck et al. | |
| 10,297,998 B2 | 5/2019 | Tsuchida et al. | |
| D850,386 S | 6/2019 | Otzelberger | |
| D850,430 S | 6/2019 | Wu | |
| D853,970 S | 7/2019 | Sipe et al. | |
| 10,476,248 B2 | 11/2019 | Baldwin et al. | |
| 2002/0130128 A1 * | 9/2002 | Berglund | B65D 43/167 220/230 |
| 2002/0153376 A1 * | 10/2002 | Seidler | B65D 51/04 220/230 |
| 2009/0001082 A1 * | 1/2009 | Goldenne | H02G 3/121 220/477 |
| 2009/0139742 A1 | 6/2009 | Bhosale | |
| 2009/0146537 A1 | 6/2009 | Wang | |
| 2009/0255725 A1 | 10/2009 | Curtis | |
| 2011/0132907 A1 * | 6/2011 | Hajichristou | B65D 50/061 220/230 |
| 2012/0325808 A1 * | 12/2012 | Batchelor | H01R 13/4532 220/3.8 |
| 2014/0166333 A1 | 6/2014 | Porcano | |
| 2016/0091681 A1 | 3/2016 | Hanson | |
| 2016/0238997 A1 | 8/2016 | Baldwin | |
| 2016/0363143 A1 * | 12/2016 | Druce | H02G 3/10 |
| 2017/0237198 A1 | 8/2017 | Sathyanarayana | |
| 2017/0344037 A1 | 11/2017 | Novotny | |
| 2017/0353020 A1 | 12/2017 | Yamashita | |
| 2018/0076600 A1 | 3/2018 | Jensen | |
| 2018/0081135 A1 | 3/2018 | Hill | |
| 2019/0140437 A1 | 5/2019 | Chen et al. | |
| 2019/0237951 A1 | 8/2019 | Franck et al. | |

FOREIGN PATENT DOCUMENTS

| | | |
|---|---|---|
| CN | 101453840 A | 6/2009 |
| CN | 100521422 C | 7/2009 |
| CN | 104377573 A | 2/2015 |
| EP | 327565 A1 | 8/1989 |
| EP | 1355399 B1 | 11/2009 |

(56) References Cited

FOREIGN PATENT DOCUMENTS

| FR | 2761827 A1 | 10/1998 |
|---|---|---|
| GB | 394036 A | 6/1933 |
| GB | 2474931 A | 5/2011 |
| GB | 2503953 A | 1/2014 |
| JP | 2008063934 A | 3/2008 |
| KR | 200417975 Y1 | 6/2006 |
| KR | 101137762 B1 | 4/2012 |
| KR | 101300543 B1 | 3/2013 |
| KR | 101521460 B1 | 5/2015 |
| KR | 20180028424 A | 3/2018 |
| SE | 507248 C2 | 5/1998 |
| WO | 2019084695 A1 | 5/2019 |

OTHER PUBLICATIONS

Primex Product Specification Sheet—Verge PR1500. (online pdf) 2 pgs. Nov. 2017. [Retrieved Nov. 27, 2019] https://primex.com/wp-content/uploads/2018/10/PR1500_Spec_Sheet.pdf.
Primex Verge PR1500 Allfield Media Distribution Enclosure. (online video) 1 pg. Jan. 5, 2018. [Retrieved Nov. 27, 2019] https://www.youtube.com/watch?v+dJHPCWxxAD4&Feature=emb_logo.
International Search Report and Written Opinion for International Patent Application No. PCT/CA2018/051397, dated Jan. 11, 2019 (9 pages).

* cited by examiner

SECTION F-F

SECTION I-I

NETWORKING ENCLOSURE ASSEMBLY WITH MAGNETIC ALIGNMENT AND INTERLOCKING, ADAPTABLE TO BE INSTALLED IN DIFFERENT LOCATIONS AND POSITIONS

CROSS-REFERENCE TO RELATED APPLICATION

This application claims the benefit of priority on the basis of Canadian Patent Application No. 2,985,012 filed on Nov. 6, 2017

I. BACKGROUND OF THE INVENTION

1. Field of the Invention

The present invention refers, in general, to networking enclosures and, more particularly, to a networking enclosure assembly with magnetic alignment and interlocking, adaptable to be installed in different locations and positions.

2. Discussion of the State of the Art

The use of electronic devices and cables in single residences, multiple-dwelling units and commercial premises, necessitates the use of networking enclosures mounted on or in walls or other locations of the premises.

Companies dealing with installation and service of this type of enclosures required the development of enclosures adapted to be placed in different locations and positions, easy to access and secure.

Attempts have been made to comply with those requirements, or, at least, to alleviate the existing shortcomings. Thus, for example, U.S. Pat. No. 9,470,867, granted on Oct. 18, 2016 to James et al, for a "RETAINING ENCLOSURE FOR ABOVE-GROUND FIBER OPTIC/CABLE NETWORK TERMINAL" discloses an enclosure using double flange brackets, dowels, hooks . . . for hinging a panel to a tray, the former and the latter constituting the basic components of the retaining enclosure. An eyelet bracket extending outwardly from the try and an opposing eyelet bracket extending from the panel are secured together by a bolt-nut. Lack of simplicity and low cost-effective performance constitute the main shortcomings of this retaining enclosure.

Another example is U.S. Pat. No. 8,457,464, granted on Jun. 4, 2013 to O'Connor for a "CABLE ENCLOSURE AND RADIUS-LIMITING CABLE GUIDE WITH INTEGRAL MAGNETIC DOOR CATCH" discloses a door catch arrangement for cable enclosures. The door catch includes magnetic catch components on the door and on an adjacent open-ended, flared, radius-limiting cable guide installed in at least one open-ended cable port of the enclosure. Although the above-mentioned cable enclosure uses magnets for a door catch, those magnets have a different use and are differently positioned when compared with the magnets incorporated in the present invention.

II. SUMMARY OF THE INVENTION

A first objective of the present invention is to devise enclosure assemblies with almost effortless, easier/faster assembling and disassembling;

A second objective of the present invention is to manufacture quality enclosure assemblies by using advanced, consistent/repeatable production processes; and A third objective of the present invention is to provide lightweight enclosure assemblies with an improved presentation.

Broadly stating the networking enclosure assembly with magnetic alignment and interlocking, adaptable to be installed in different locations and positions, comprises a receptacle subassembly, a lid subassembly telescopically interacting with the receptacle subassembly by partially penetrating into or by retracting from the receptacle subassembly and a magnetic unit attached to the receptacle subassembly and to the lid subassembly and intended to align and interlock the receptacle subassembly with the lid subassembly. The receptacle subassembly has a cuboid body and constitutes a monobloc of hard plastic material. The receptacle subassembly includes an erect back wall, a pair of lateral walls extending along lateral extremities of and perpendicularly to the erect, back wall, a top wall extending horizontally, coplanar with upper edges of the erect, back wall and of the pair of lateral walls and a bottom wall extending horizontally, coplanar with lower edges of the erect, back wall and of the pair of lateral walls; a pair of first entrapping pockets, wherein each one of the pair of first entrapping pockets extending laterally, inwards from each one of the first entrapping pockets incorporating a parallelepipedic cavity, the entrapping pocket having a front opening constituting an extension of the parallelepipedic cavity and an elongated window facing, along a whole length of the first entrapping pocket, an interior of the receptacle subassembly; the first entrapping pocket further incorporating: 1) a pair of opposed, parallel and horizontally extending segments, inwardly projecting from each one of the pair of lateral walls; 2) a pair of slanted segments following the pair of opposed, parallel and horizontally extending segments; and 3) a pair of opposed, vertical segments extending from the pair of slanted segments and delimiting the elongated window; the first entrapping pocket starting from the front extremity of each wall of the pair of lateral walls forming a somewhat diverging surface that extend inwardly into the receptacle subassembly, starting from the front opening and continuing along a whole length of the first entrapping pocket; the lid subassembly constituting a hard plastic unitary structure that incorporates an external shell provided with internal enveloping surfaces, wherein an internal shell, provided with external enveloped surfaces, is integrated; the external shell having a frame shape including a pair of laterally spaced, vertical sides, a top side extending horizontally, coplanar with upper edges of the pair of laterally spaced, vertical sides and a bottom side extending horizontally, coplanar with lower edges of the pair of laterally spaced, vertical sides; each one of the pair of laterally spaced, vertical sides incorporating a prism-shape recess having six faces, all rectangular; the prism-shape recess being located at midway between the top side and the bottom side and extending into an interior of the external shell; a pair of opposed horizontal edges at an entrance of prism-shape recess being chamfered to facilitate alignment and insertion of the first entrapping pocket; each the prism-shape recess extending laterally, inwards into a second entrapping pocket which is defined firstly by an opening entrance, coplanar with a front of each one of the pair of laterally spaced, vertical sides and, secondly, by a lateral extending window for facing the first entrapping pocket, each second entrapping pocket being further defined by a pair of opposed flanks starting from the front extremity of each one of the pair of laterally spaced, vertical sides and extending divergently and inward into the external shell; each one of the pair of opposed flanks being so inclined as to glidingly engage a slanted segment of each first entrapping pocket; each one of the pair of laterally spaced, vertical sides ending backwards in one recessed circular segment, traversed by an opening; the recessed circular segment and the opening being adapted for lodging a camlock; the internal shell incorporates an end wall coplanar with and spaced from an end contour of the external shell; the end wall including a closing chord surface of the recessed circular segment; several ties being provided with first and second ends, the first ends being attached to a zone spaced internally from an entrance of the external shell, while the second ends being joined to partial contour zones situated at a top and a bottom of the end wall; and parts of the end wall corresponding to the recessed circular segments are used for grabbing and positioning the enclosure assembly. In the first entrapping pocket and in the second entrapping pocket that are positioned at one side, at left of the enclosure assembly, a first magnet element is captured i.e. rendered captive with an interferential fit; correspondingly, in the first entrapping pocket and in the second entrapping pocket that are positioned at another side, at right of the enclosure assembly, a second magnet element being captured with an interferential fit; between the elongated window of the first entrapping pocket and the lateral extending window of the second entrapping pocket a clearance being established. While said lid subassembly is positioned for insertion into the receptacle subassembly, the first magnet collaboratively interact with the second magnet for easily aligning the lid subassembly into the receptacle subassembly; when the lid subassembly by translation reaches a position when the elongated window confronts the lateral extending, the first magnet interacts with the second magnet to releasably secure the lid assembly to the cover assembly; between the first magnet and the second magnet, when the first magnet and the second magnet are in a confronted position, an interstice is preestablished; and at least one of the first and second magnets is a permanent metal magnet.

In one aspect of this invention, the lid subassembly further incorporates a frame unit somewhat laterally spaced from an exterior of the external shell and encompasses the external shell. The frame unit includes an external frame joined frontally via a flat zone to an essentially parallel internal frame. The frame unit has a top and a bottom horizontal wall and a pair of opposed vertical walls joined at the extremities of the top and bottom horizontal walls. Each one of the pair of opposed vertical walls is discontinued at their middle by an indented circular segment corresponding to the recessed circular segment. Several frangible links located at an end of the essentially parallel internal frame for connecting the external essentially parallel internal frame to an outside surface of the external shell. Thus, optionally, the external frame unit could be detached from the external shell. The frame unit is normally used to cover an unaesthetic transitional zone between a contour of the external enclosure assembly and a wall opening wherein the external enclosure assembly is installed.

In another aspect of this invention, the networking enclosure assembly further comprises a connector entity succeeding each first entrapping pocket and extending inwardly into the receptacle subassembly and adaptable to cooperate with a camlock (not shown). The connector entity firstly comprises an adapter with a U-shape body having an initial edge spaced from an inside surface of each one of the pair of lateral walls and an end edge in contact with an inside surface of each one of the pair of lateral walls. As a result, the adapter occupies an inclined position, behind which a hollow zone is formed. The adapter incorporates a pair of spaced legs, each spaced leg of the pair of spaced legs being wedge-shaped with a narrow extremity coinciding with the initial edge. The pair of spaced legs is divergently extending. A pair of stop shoulders follow the adapter and the flank end edge. The connector entity further comprises a toothed extension incorporating a channel shape section interconnected with a comb shape section having several parallel, vertical teeth. The channel shape section is so configured as to engage with a light-press fit said U-shaped adapter. An L-shape lever (not shown) is used to provide a firm connection between one of the several parallel, vertical teeth and an adaptable camlock installed in the lid subassembly. Thus, an unauthorized access to the enclosure assembly could be preempted.

III. BRIEF DESCRIPTION OF THE DRAWINGS

The subject matter of the present invention is particularly pointed out and distinctively claimed in the concluding portion of this specification. The invention, however, both in structure and operation, may be better understood by reference to the following description taken in conjunction with the subjoined claim and the accompanying drawings of which:

V. DESCRIPTION OF THE PREFERRED EMBODIMENT

Figure 1:
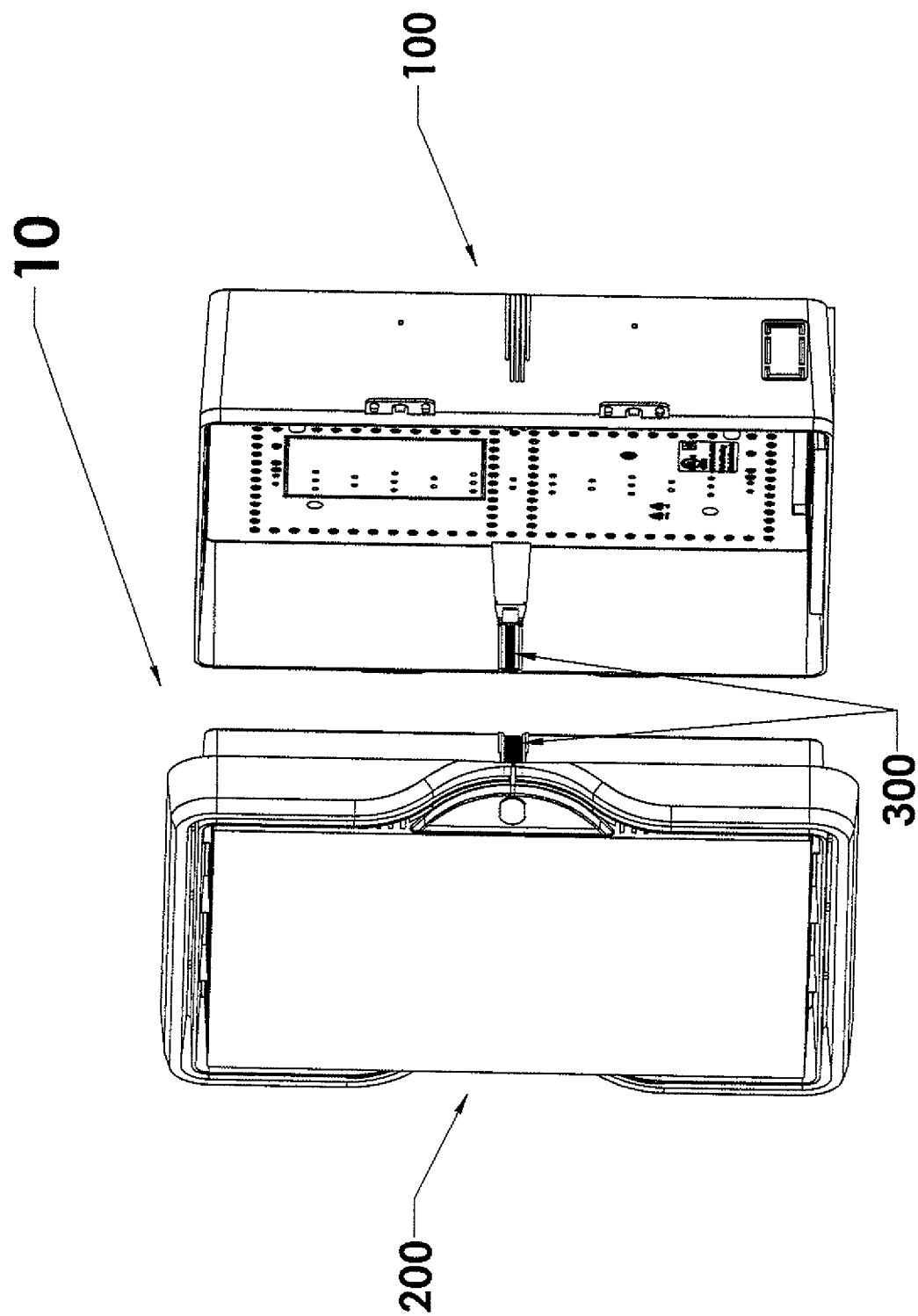
FIG. 1 illustrates a perspective, exploded view of the "Networking enclosure assembly with magnetic alignment and interlocking, adaptable to be installed in different locations and positions"
Figure 2:
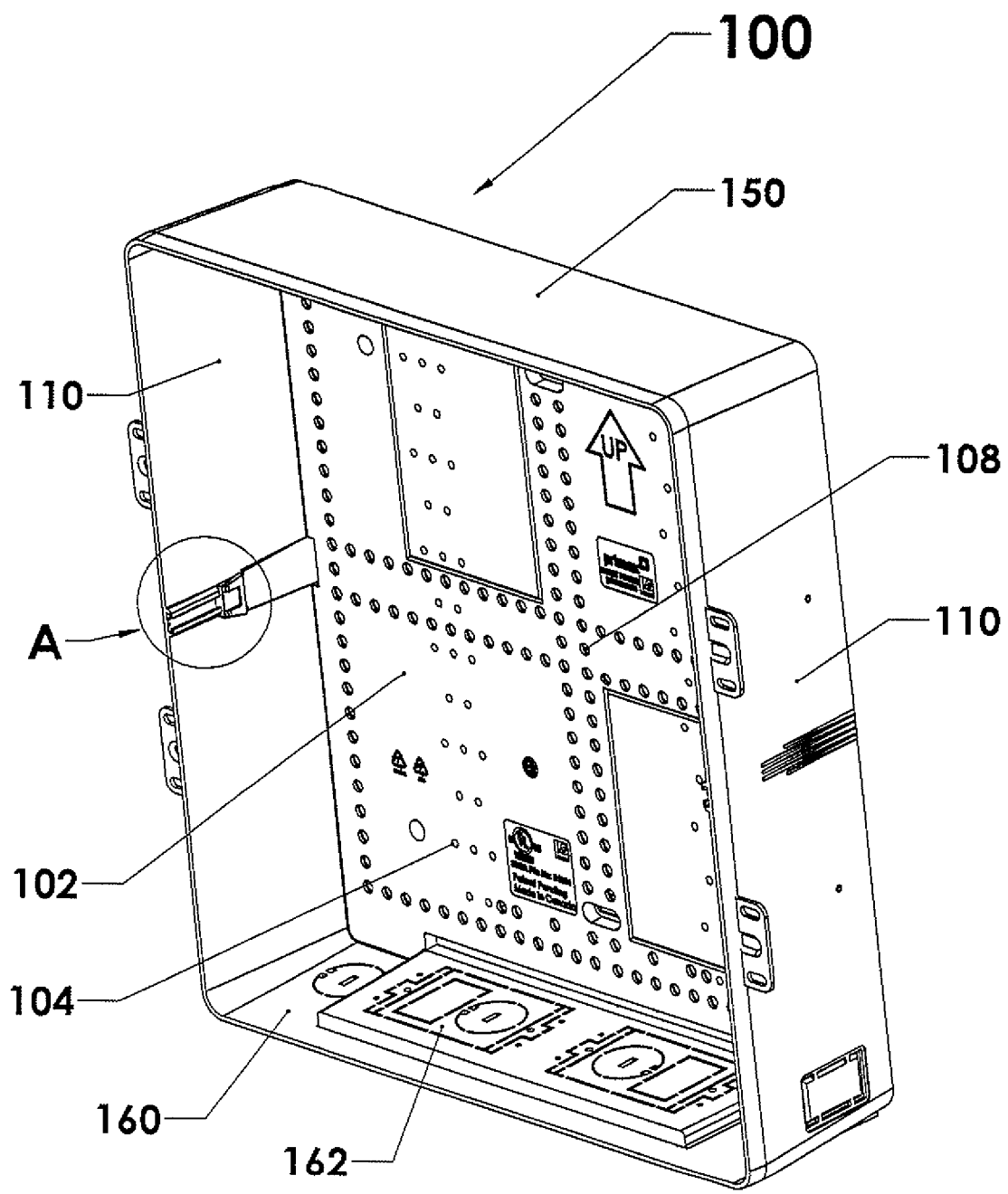
FIG. 2 illustrates a perspective front view of the receptacle subassembly.
Figure 3:
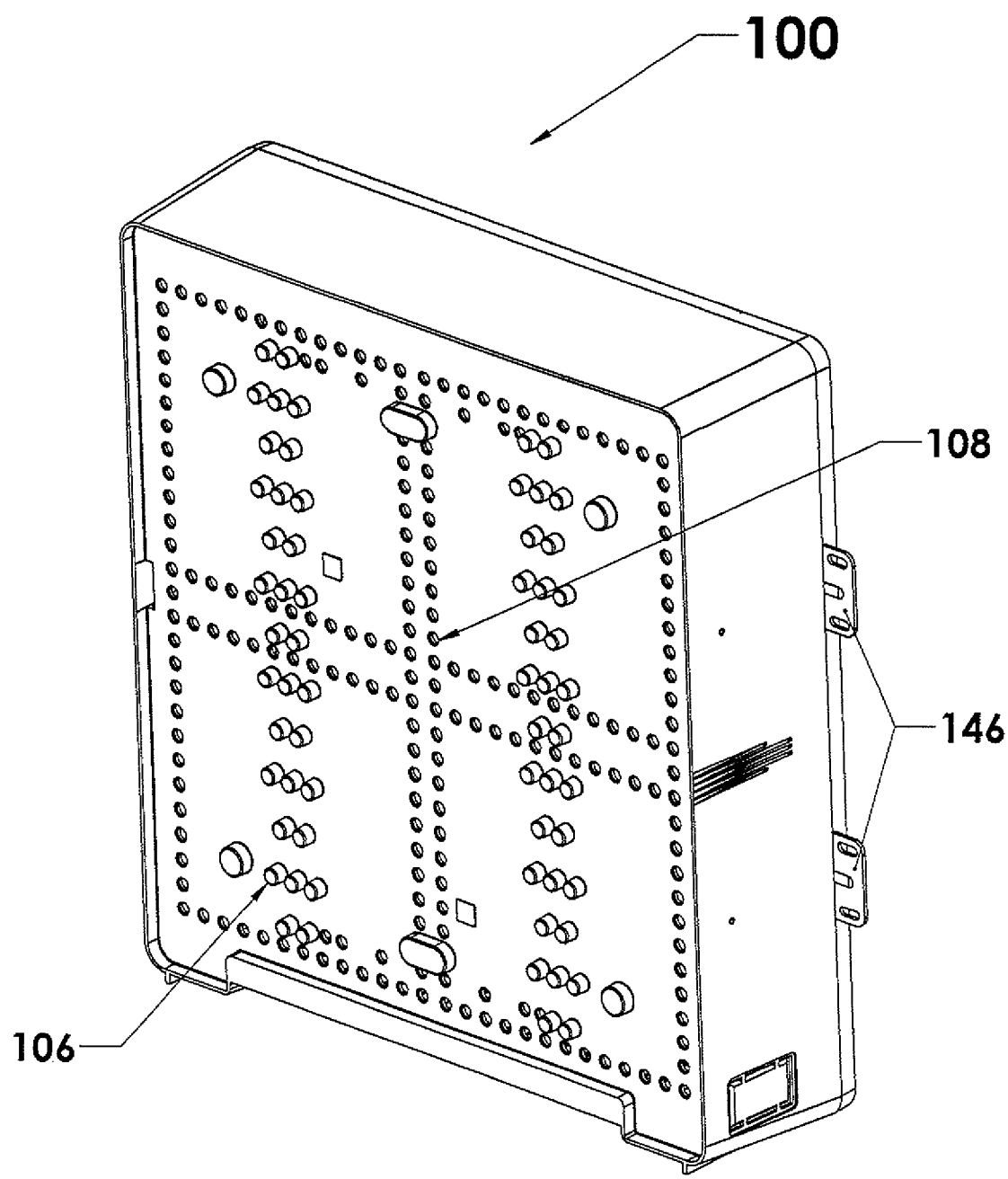
FIG. 3 illustrates a perspective back view of the receptacle subassembly.
Figure 4:
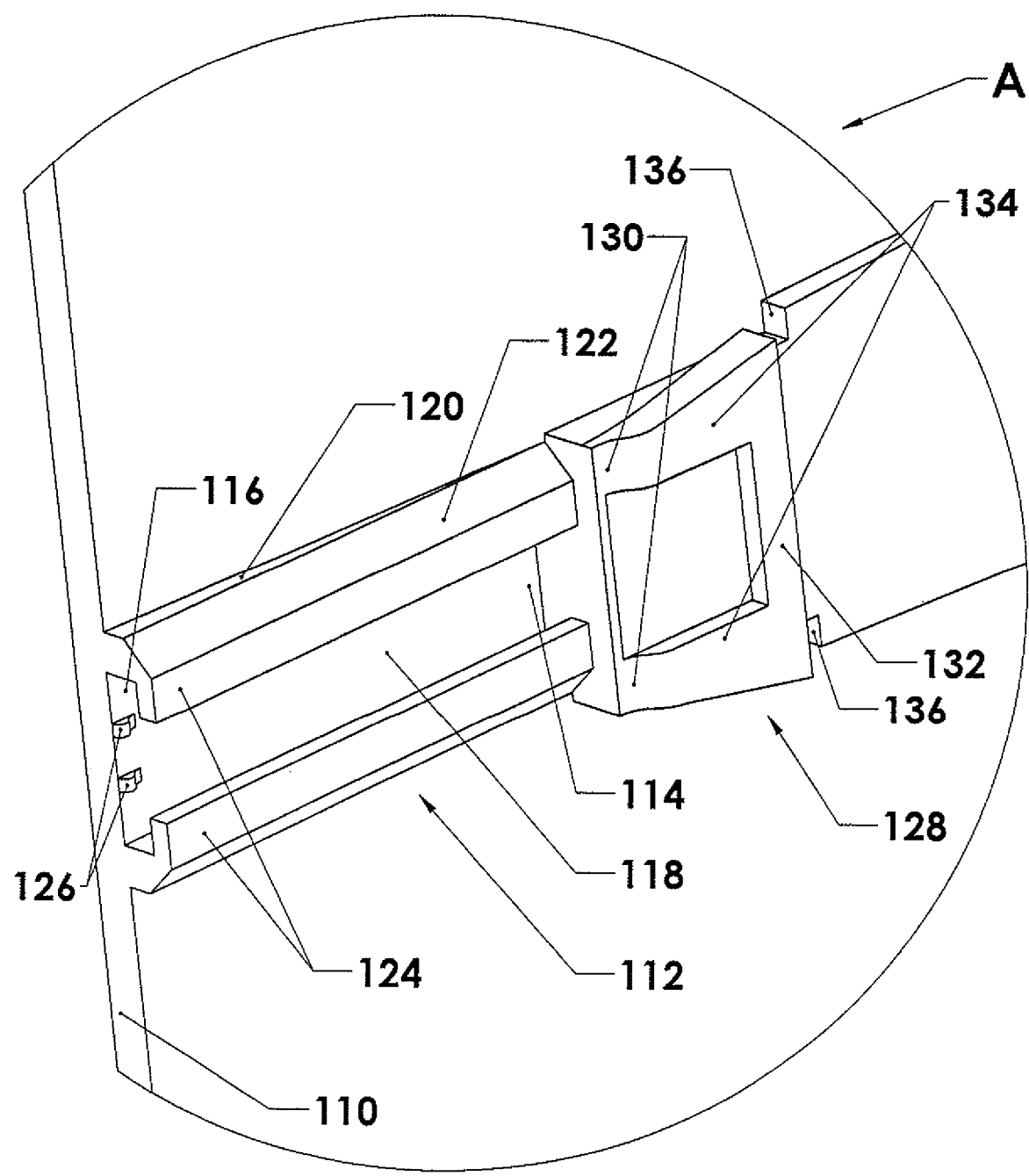
FIG. 4 depicts an enlarged image of local view A shown in FIG. 2.
Figure 5:
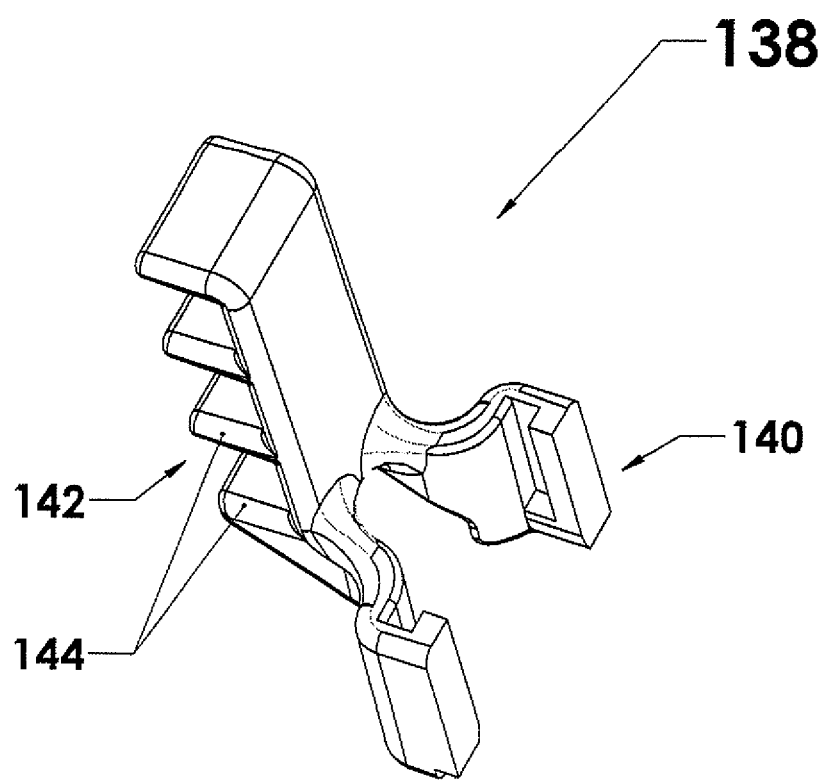
FIG. 5 illustrates a perspective view of a toothed extension.
Figure 6:
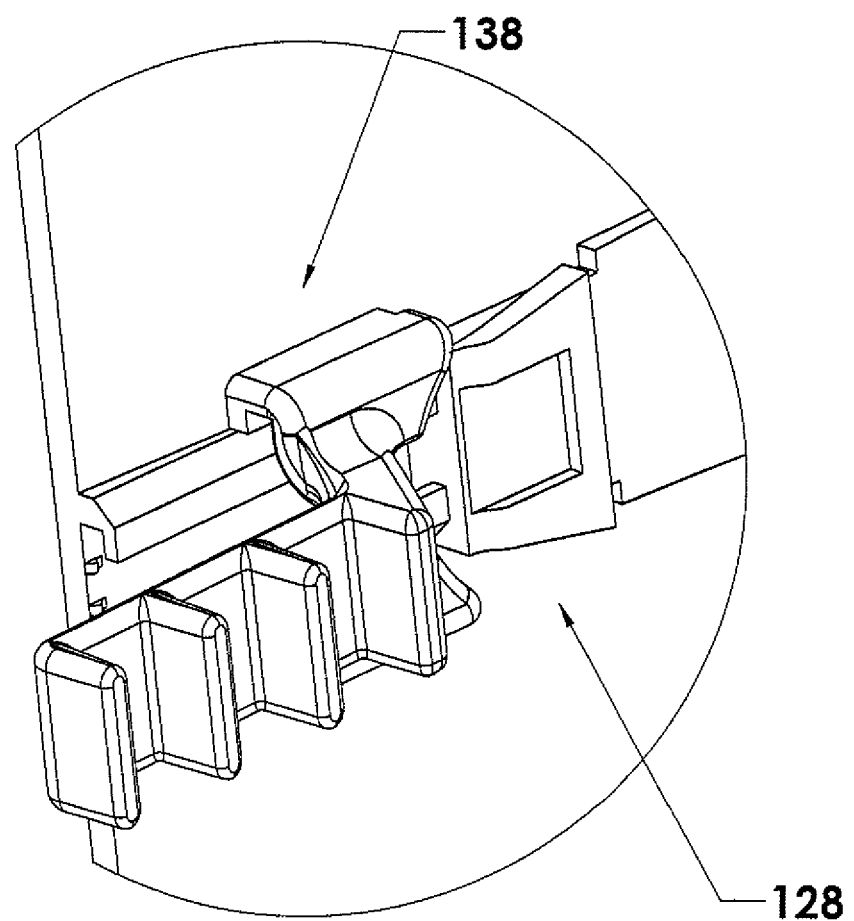
FIG. 6 illustrates FIG. 4 showing a toothed extension ready to engage an adapter.
Figure 7:
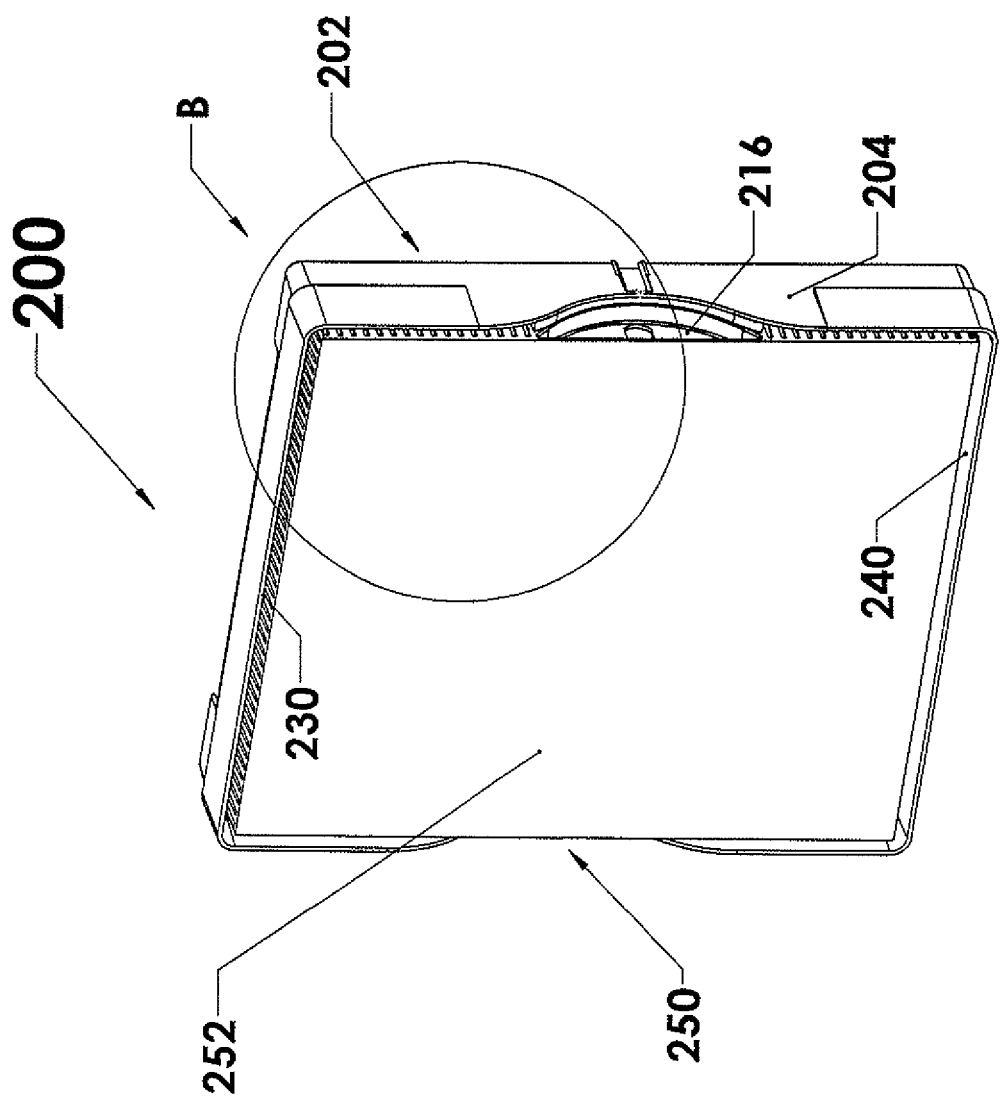
FIG. 7 illustrates a perspective front view of the lid subassembly.
Figure 8:
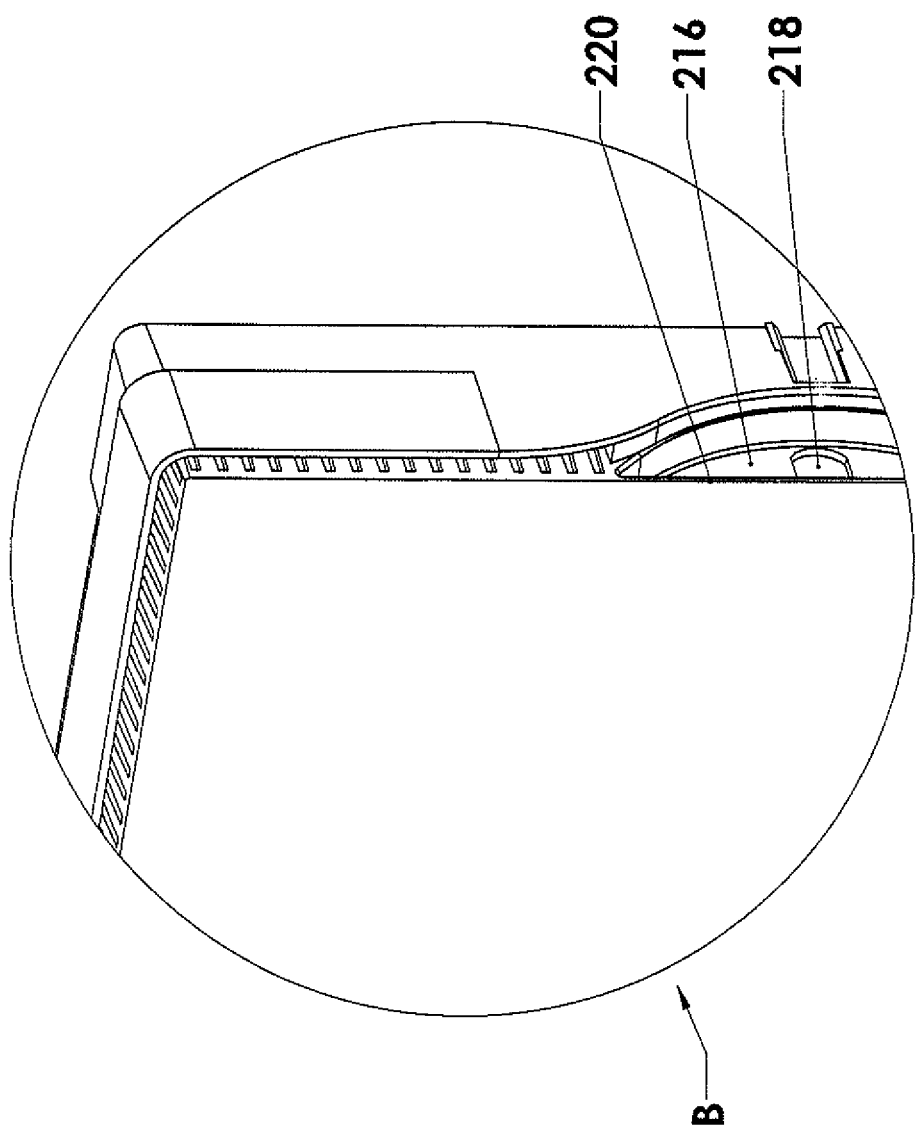
FIG. 8 depicts an enlarged image of local view B shown in FIG. 7.
Figure 9:
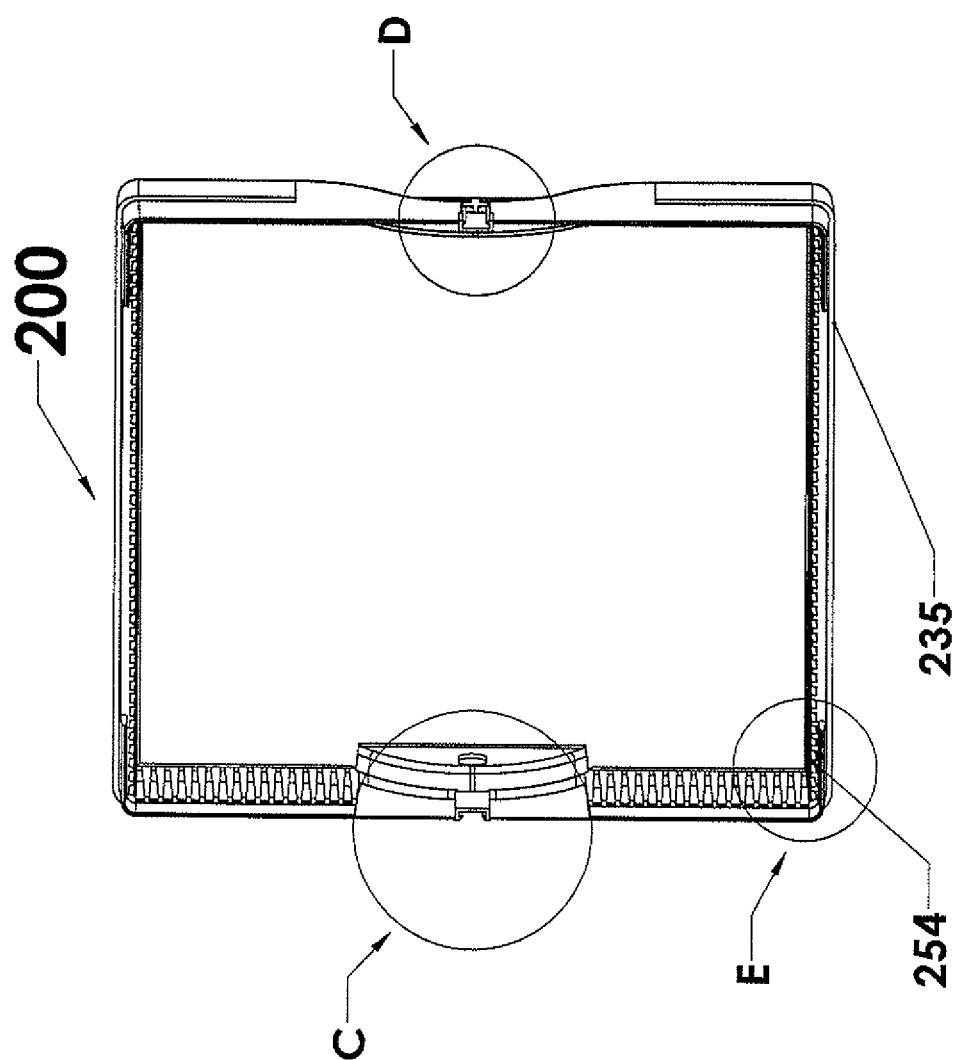
FIG. 9 illustrates FIG. 7 wherein local views C, D and E are indicated.
Figure 10:
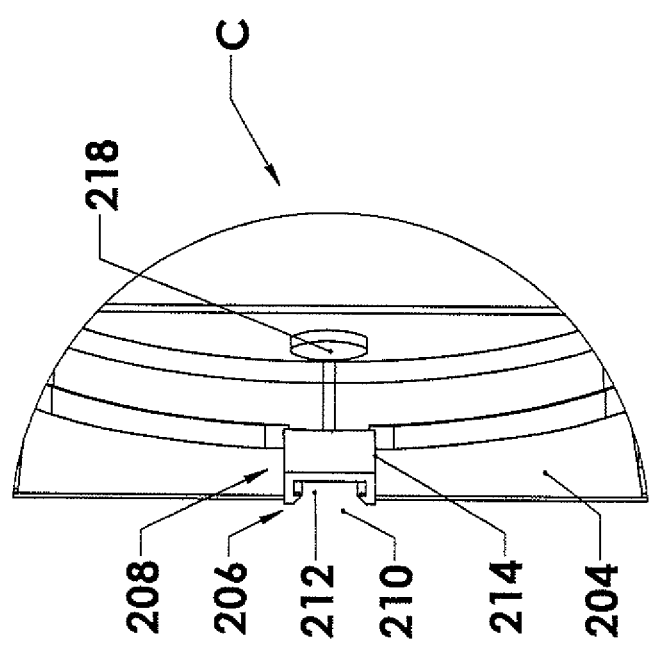
FIG. 10 depicts an enlarged image of local view C shown in FIG. 9.
Figure 11:
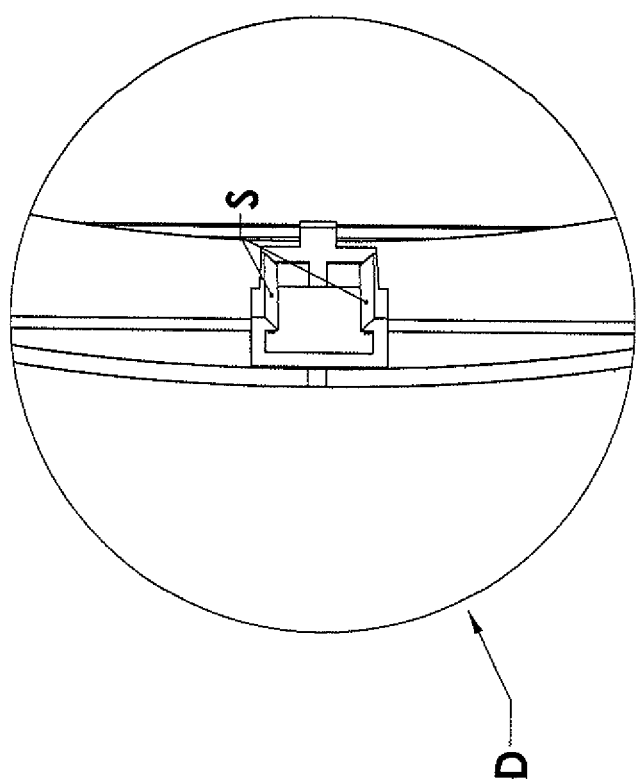
FIG. 11 depicts an enlarged image of local view D shown in FIG. 9.
Figure 12:
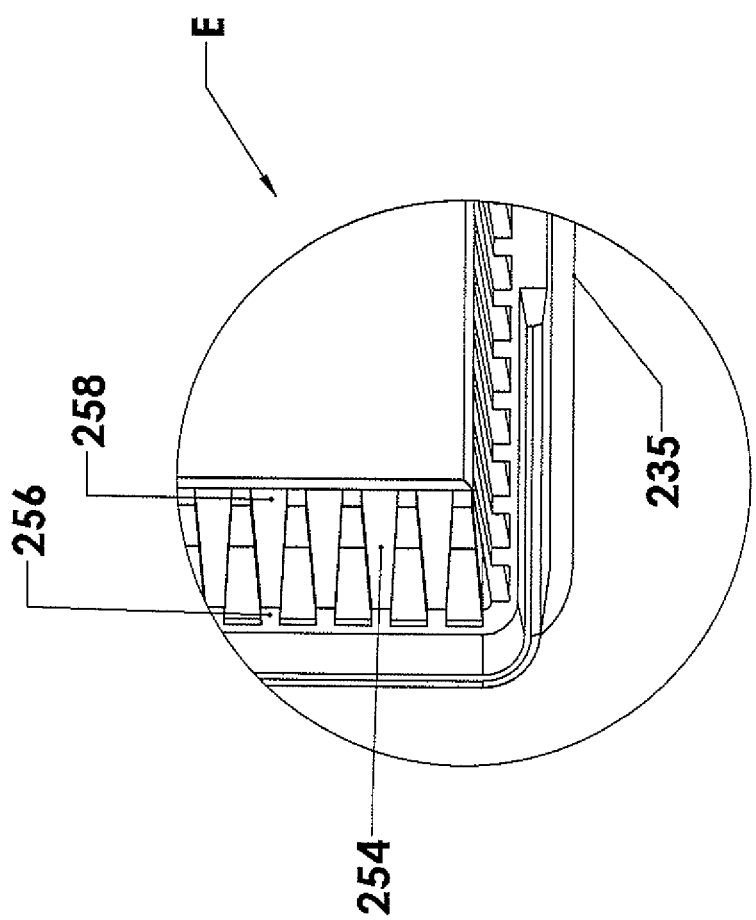
FIG. 12 depicts an enlarged image of local view E shown in FIG. 9.
Figure 13:
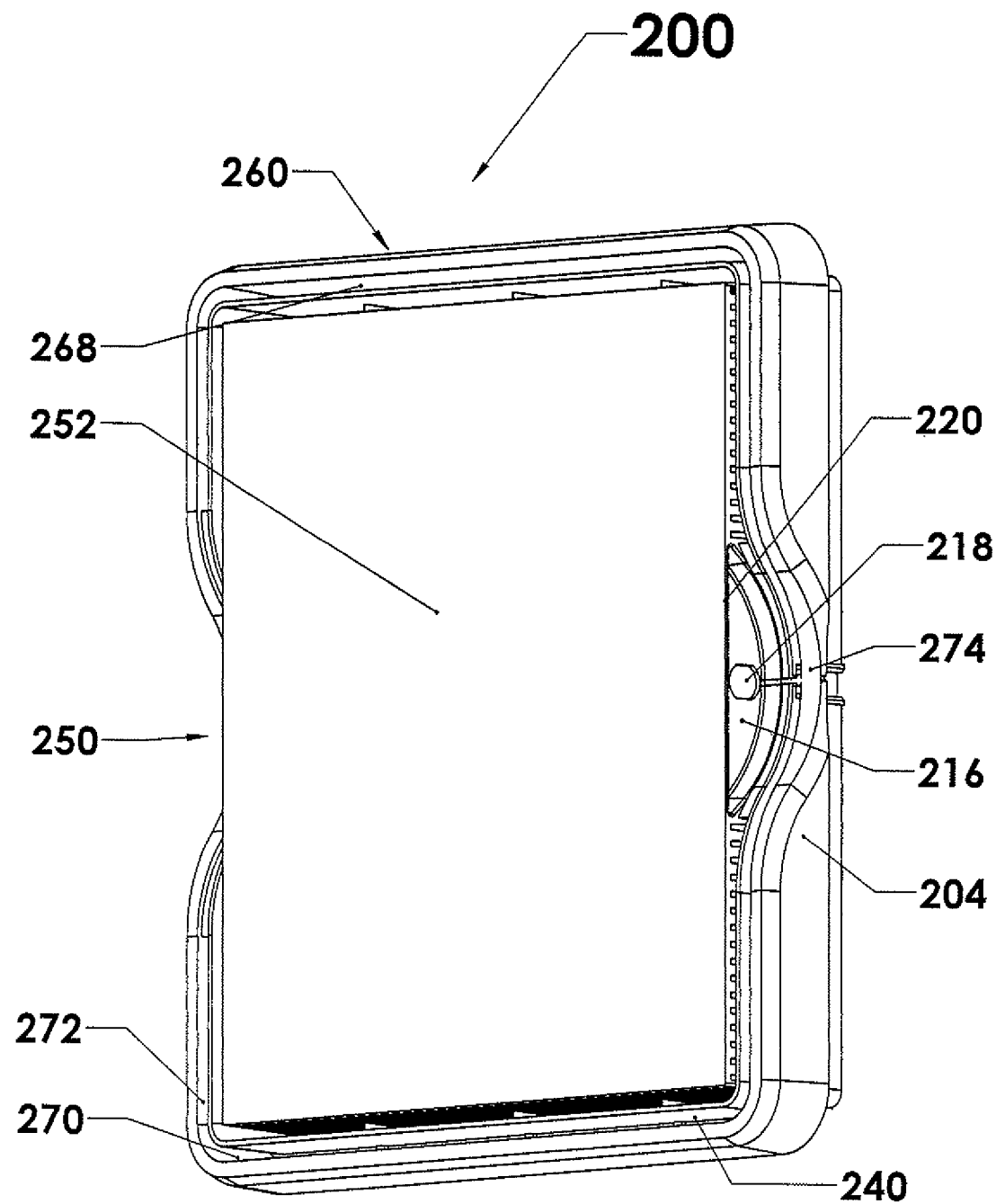
FIG. 13 illustrates a perspective view of the lid subassembly with an incorporated frame unit.
Figure 14:
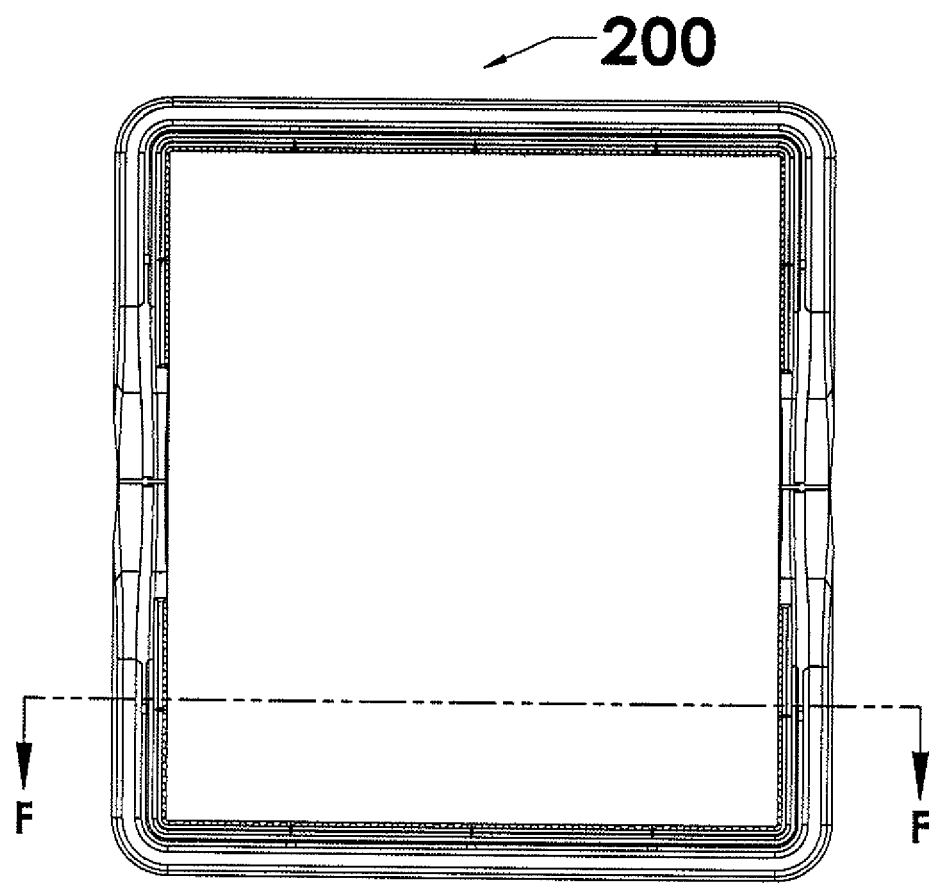
FIG. 14 illustrates an elevation frontal view of FIG. 13, on which a transversal sectional line F-F is depicted.
Figure 15:
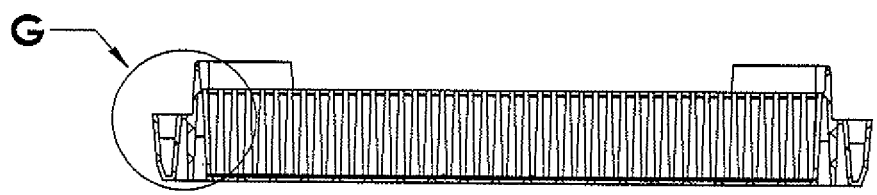
FIG. 15 depicts the cross-section F-F of FIG. 14.
Figure 16:
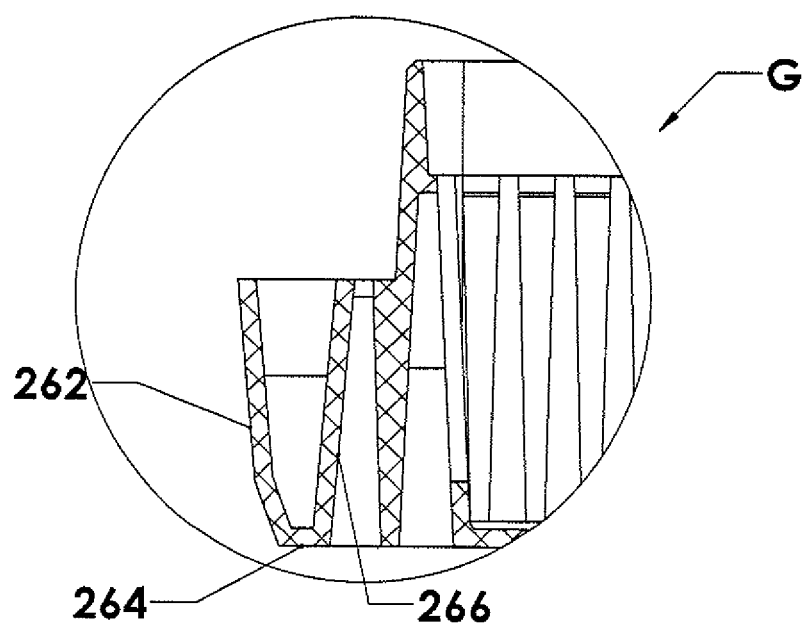
FIG. 16 depicts an enlarged image of local view G shown in FIG. 15.
Figure 17:
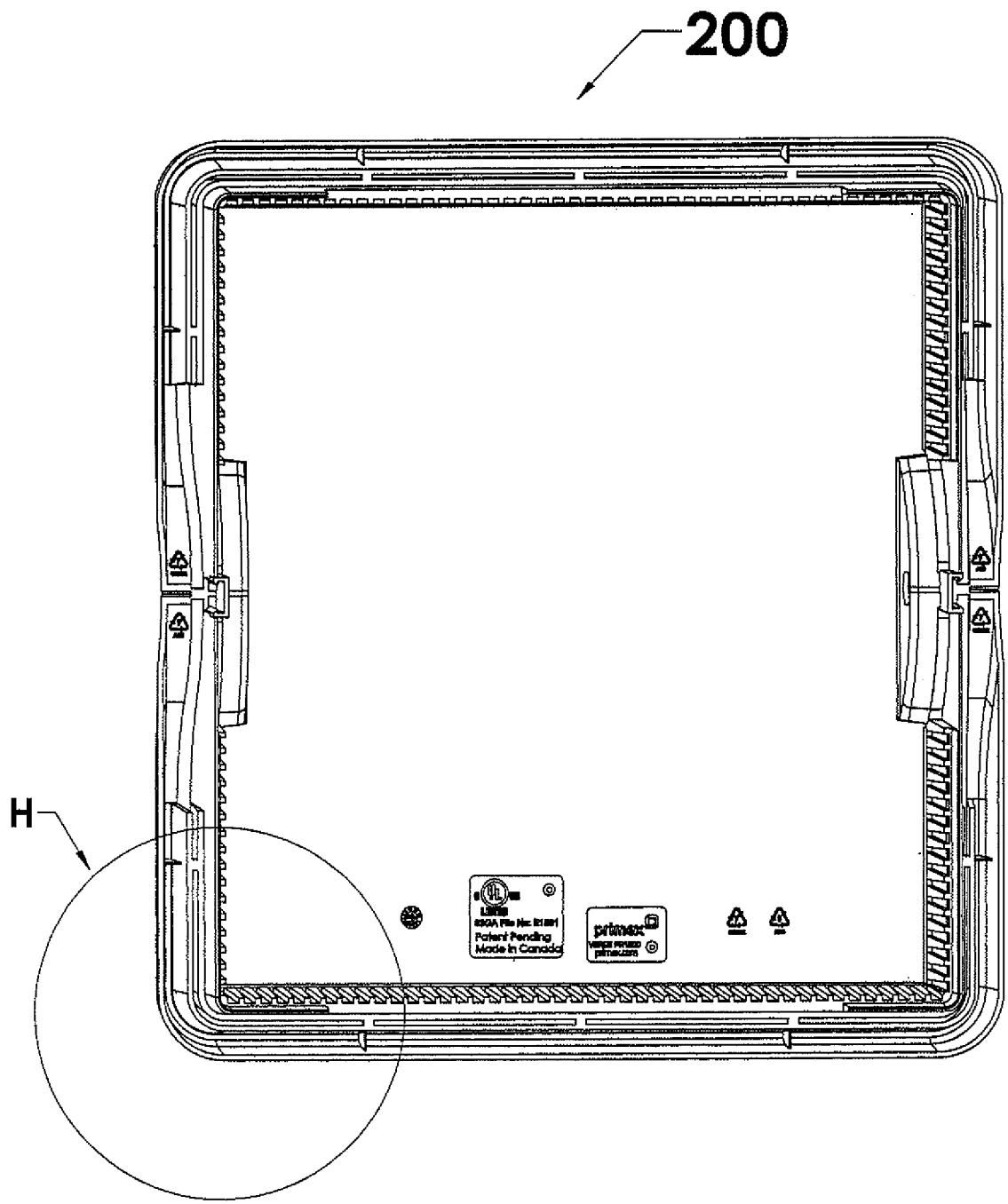
FIG. 17 illustrates lid subassembly incorporating the frame unit and indicating an encircled zone H.
Figure 18:
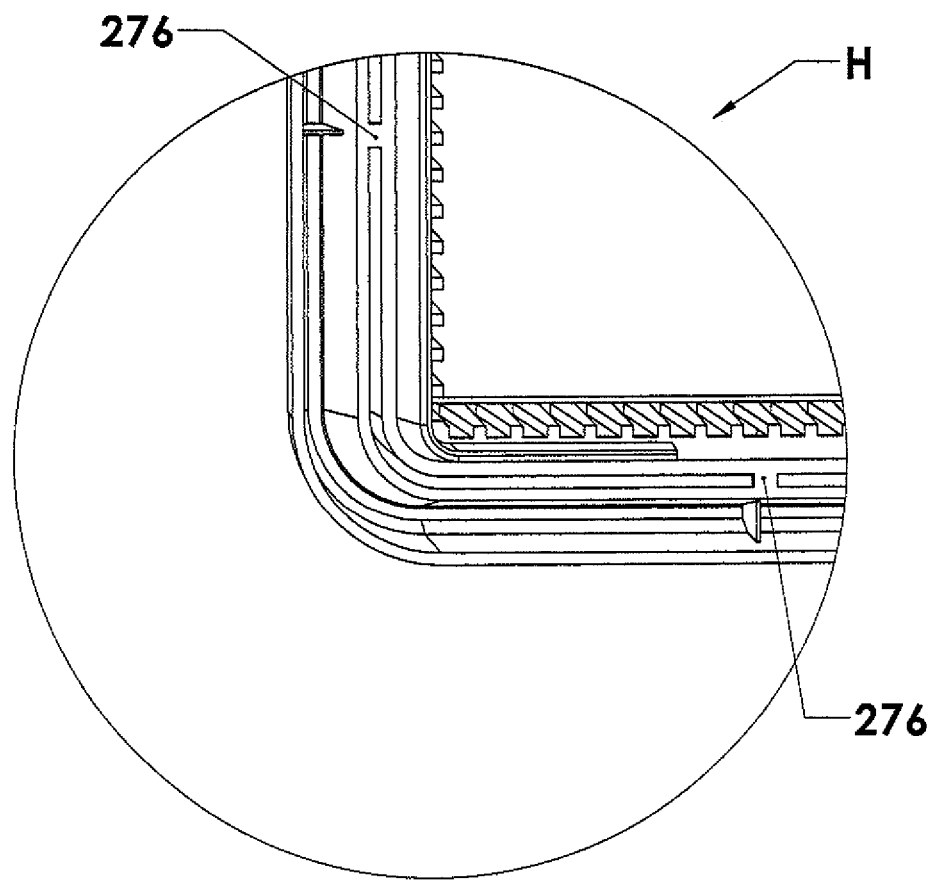
FIG. 18 illustrates an enlarged view of an encircled zone H, depicted in FIG. 17.
Figure 19:
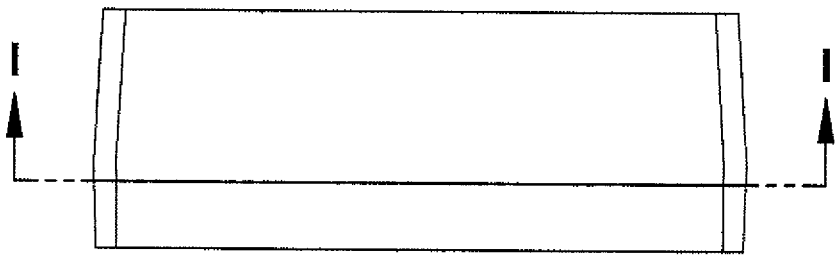
FIG. 19 depicts a diagrammatic top view of the enclosure assembly intersected by a vertical section plane I-I extending throughout the zone where each pair of opposite, adjacent magnets confront each other.
Figure 20:
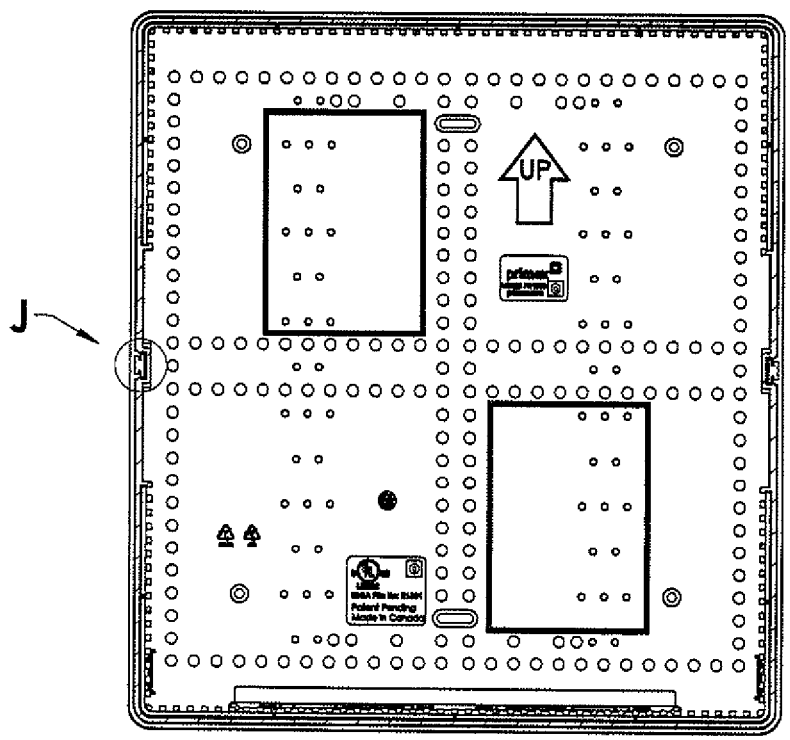
FIG. 20 illustrates a cross-section I-I of FIG. 19.
Figure 21:
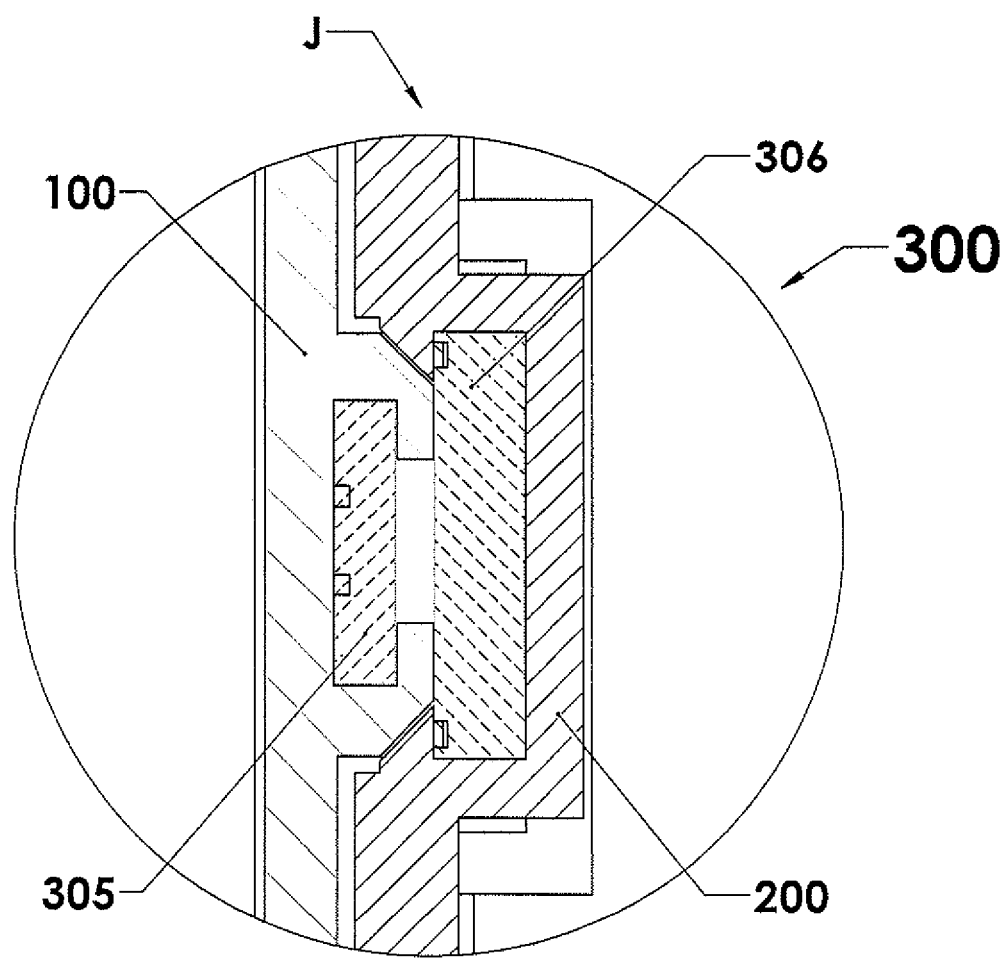
FIG. 21 illustrates a enlarged view of encircled zone J from FIG. 20.

As a caveat, before the preferred invention and its variants of use are explained in detail, it is to be agreed that the invention is not limited in its application to the structural details and the arrangement of the components set forth in the following description and illustrated in the accompanying drawings. This invention is applicable to other embodiments and of being practiced or of being carried out in various variants. Also, it to be understood that the terms used herein with reference to the orientation of the "NETWORKING ENCLOSURE ASSEMBLY WITH MAGNETIC ALIGNMENT AND INTERLOCKING, ADAPTABLE TO BE INSTALLED IN DIFFERENT LOCATIONS AND POSITIONS", such as "vertical", "horizontal", "forward", "backward", "top", "bottom", "upper", "lower", "left", "right" and the like, are only used to better understand the description of the present invention with reference to a working, vertical position of use. Reference numeral 10 was chosen for generally naming the above mentioned preferred embodiment of this invention. For simplification, in the following description, the wording "enclosure assembly 10" substitutes the "networking assembly with magnetic alignment and interlocking, adaptable to be installed in different locations and positions 10". Generally stating, with reference to FIGS. 1 through 21, an embodiment of enclosure assembly 10 comprises, in combination:

- a receptacle subassembly 100;
- a lid subassembly 200 telescopically interacting with receptacle subassembly 10 by partially penetrating into the latter, or by retracting therefrom; and
- a magnetic unit 300 attached to receptacle subassembly 100 and to lid subassembly 200 and intended to align and interlock the former with the latte latter.

Describing now in detail, receptacle subassembly 100 incorporates a cuboid body, i.e. is rectangular prism-shaped and is made as a monobloc of hard plastic material. Receptacle subassembly 100 includes

- an erect back wall 102;
- a pair of lateral walls 110, extending along lateral extremities of erect, back wall 102, perpendicularly to the latter;
- a top wall 150 extending horizontally, coplanar with the upper edges of erect, back wall 102 and of the pair of lateral walls 110; and
- a bottom wall 160 extending horizontally, coplanar with the lower edges of erect, back wall 104 and of the pair of lateral walls 106.

Erect, back wall 102 is provided with a plurality of circular, blind apertures 104, each of the later coaxially extending backwards into an integral cylinder 106 having a diameter relatively larger than that of plurality of circular, blind apertures 104. The latter are intended to secure via screws (not shown) various, electronic accessories. Erect, back wall 102 further incorporates a multiplicity of circular openings 108 having a diameter relatively larger than that of the plurality of circular, blind apertures 104. Multiplicity of circular openings 108 are intended for attaching via push-pins (not shown) various electronic devices.

A pair of first entrapping pockets 112, wherein each first entrapping pocket 112 extends laterally, inwards from each one of the pair of lateral walls 110, at midway between top wall 150 and bottom wall 160. Each first entrapping pocket 112 incorporates a parallelepipedic cavity 114, i.e. a 6-faced polyhedron. First entrapping pocket 112 has a front opening 116 that constitutes an extension of parallelepipedic cavity 114 and an elongated window 118 facing, along a whole length of first entrapping pocket 112, an interior of receptacle subassembly 100.

First entrapping pocket 112 further incorporates: 1) a pair of opposed, parallel and horizontally extending segments 120, inwardly projecting from each one of the pair of lateral walls 110; 2) a pair of slanted segments 122 following horizontally extending segments 120; and 3) a pair of opposed, vertical segments 124 extending from the pair of slanted segments 122 and delimiting elongated window 118. Parallelepipedic cavity 110 ends internally with a first pair of end stoppers 126.

In one variant of the present embodiment, each first entrapping pocket 112 is succeeded by a adapter 128, which, further extends inwardly into receptacle subassembly 100 and is adaptable to cooperate with a camlock (not shown). Adapter 128 incorporates an U-shape body having an initial zone edge 130 spaced from an inside surface of each one of the pair of lateral walls 110 and an end zone edge 132 in contact with inside surface of each one of the pair of lateral walls 110. As a result, adapter 128 occupies an inclined position, behind which a hollow zone is formed. Adapter 128 incorporates a pair of spaced legs 132, each spaced leg 132 being wedge-shaped with a narrow extremity coinciding with initial zone edge 130. The pair of spaced legs 132 are divergently extending. A pair of stop shoulders 134 follow adapter 128 and flank end edge 132.

Adapter 128 further interacts with a toothed extension 136 incorporating a channel shape section 138 interconnected with a comb shape section 140 having several parallel, vertical teeth 142. Channel shape section 140 is configured to engage with a light-press fit adapter 128. An L-shape lever (not shown) is used to provide a firm connection between one of several parallel, vertical teeth 142 and a camlock installed in lid subassembly 200. Thus, an unauthorized access to enclosure assembly 10 could be preempted.

A pair of slotted flanges 144 projecting outwardly from each one of the pair of lateral walls 110 are positioned in parallel with erect back wall 102. The pair of slotted flanges 144 are used for wall attaching of enclosure assembly 10.

Bottom wall 160 is provided with knock-out apertures 162 for cables passage.

Lid subassembly 200 constitutes a hard plastic unitary structure that incorporates an external shell 202 provided with internal enveloping surfaces, wherein an internal shell 250, provided with external enveloped surfaces, is integrated.

External shell 202 has a frame shape that includes
- a pair of laterally spaced, vertical sides 204;
- a top side 230 extending horizontally, coplanar with the upper edges of the pair of laterally spaced, vertical sides 204; and
- a bottom side 240 extending horizontally, coplanar with the lower edges of the pair of laterally spaced, vertical sides 204.

Each one of the pair of laterally spaced, vertical sides 204 incorporates a prism-shape recess 206 having six faces, all rectangular. Prism-shape recess 206 is located at midway between top side 230 and bottom side 240 and extends into an interior of external shell 202. A pair of opposed horizontal edges (not shown) at an entrance of prism-shape recess 206 are chamfered to facilitate the alignment and insertion of first entrapping pocket 112.

Each prism-shape recess 206 extends laterally, inwards into a second entrapping pocket 208 which is defined firstly by an opening entrance 210, coplanar with a front of each one of the pair of laterally spaced, vertical sides 204 and, secondly, by a lateral extending window 212 for facing first entrapping pocket 112. Each second entrapping pocket 208 is further defined by a pair of opposed flanks 214 starting from the front extremity of each one of the pair of laterally spaced, vertical sides 204 and extending divergently and inwardly into external shell 202. Each one of the pair of opposed flanks 214 is so inclined as to glidingly engage a slanted segment 118 of each first entrapping pocket 112. Each one of the pair of laterally spaced, vertical sides 204 ends backwardly in a recessed circular segment 216 traversed by an opening 218. Recessed circular segment 216 and opening 218 are intended for lodging a camlock (not shown).

Top side 230 and bottom side 240 of external shell 202 are both provided with an outwards projecting flat protrusion 235 used to stop the advancement of lid subassembly 200 after elongated window 116 opposes lateral extending window 212.

Internal shell 250 incorporates an end wall 252 coplanar with and spaced from an end contour 203 of external shell 202. End wall 252 includes a closing chord surface 220 of recessed circular segment 216. Several ties 254 provided with first and second ends 256 and 258 are used, first ends 256 being attached to a zone spaced internally from an entrance of external shell 202, while second ends 258 being joined to partial contour zones CZ situated at a top and a bottom of end wall 252. Parts of end wall 252 that correspond to recessed circular segments 216 are used for grabbing and repositioning enclosure assembly 10.

Lid subassembly 200 further incorporates a frame unit 260 which is somewhat laterally spaced from an exterior of external shell 202 and encompasses the latter. Frame unit 260 includes an external frame 262 joined frontally via a flat zone 264 to an essentially parallel internal frame 266. Frame unit 260 has a top and a bottom horizontal wall, respectively 268 and 270 and a pair of opposed vertical walls 272 joined at the extremities of top and bottom horizontal walls 268 and 270. Each one of the pair of opposed vertical walls 272 is discontinued at their middle by an indented circular segment 274 corresponding to recessed circular segment 216. Several frangible links 276 located at an end of essentially parallel internal frame 266 connect the latter to an outside surface of external shell 202. Thus, optionally, frame unit 260 could be detached from external shell 202. Frame unit 260 is normally used to cover an unaesthetic transitional zone between a contour of enclosure assembly 10 and a wall opening wherein enclosure assembly 10 is installed.

Magnetic unit 300 attached to receptacle subassembly 100 and to lid subassembly 200 and intended to align and interlock the former with the latte latter.

In first entrapping pocket 112 and in second entrapping pocket 208 that are positioned at one side, at left of enclosure assembly 10, a first magnet element 305 is captured and rendered captive with a press i.e. interferential fit. Correspondingly, in first entrapping pocket 112 and in second entrapping pocket 208 that are positioned at another side, at right of enclosure assembly 10, a second magnet element 306 is captured with an interferential fit. Between elongated window 116 of first entrapping pocket 112 and lateral extending window 212 of second entrapping pocket 208 a clearance is established.

When lid subassembly 200 is positioned for insertion into receptacle subassembly 100, first magnet 305 collaboratively interact with second magnet 306 for easy aligning lid subassembly 200 into receptacle subassembly 100. When lid subassembly 200 by translation reaches a position when elongated window 116 confronts lateral extending window 212, first magnet 305 collaboratively interact with second magnet 306 to releasably secure lid assembly 200 to cover assembly 100. Between first magnet 305 and second magnet 306, when the former and the latter are in a confronted position, an interstice is preestablished.

At least first magnet 305 or second magnet 306 is a permanent metal magnet.

As required, a detailed embodiment of the present invention is disclosed herein; however, it is to be understood that the disclosed embodiment is merely exemplary of the invention which may be embodied in various forms. Therefore, specific structural and functional details are not to be interpreted as limiting, but merely as a basis for the claims and as representative basis for teaching one skilled in the art to variously employ the present invention in virtually any appropriately detailed structure.

The embodiments of the invention in which an exclusive property or privilege is claimed are defined as follows:

1. An apparatus comprising:
   a receptacle comprising a first structure comprising first alignment surfaces and a first magnet; and
   a lid that telescopically interacts with the receptacle, the lid comprising a second structure comprising second alignment surfaces and a second magnet, the lid further comprising a frame, an end wall, and a plurality of ties attaching the end wall to the frame, the plurality of ties spaced apart from another to define a plurality of openings extending through the lid to permit air flows into and out of the receptacle,
   the first alignment surfaces positioned to contact the second alignment surfaces such that when the first alignment surfaces contact the second alignment surfaces, the first alignment surfaces and the second alignment surfaces (i) align the lid with the receptacle by restricting movements of the lid to a movement direction relative to the receptable and (ii) position the first magnet across from the second magnet in a direction transverse with the movement direction so that (iii) the first magnet and the second magnet interlock the lid with the receptacle by moving the second alignment surfaces along the first alignment surfaces in the movement direction using a magnetic force generated between the first magnet and the second magnet.

2. The apparatus of claim 1, wherein the receptacle comprises a back wall and a plurality of openings extending through the back wall to receive one or more attachment elements for mounting electronic devices in the receptacle.

3. The apparatus of claim 1, wherein:
   the first structure comprises a first pocket for the first magnet; and
   the second structure comprises a second pocket for the second magnet.

4. The apparatus of claim 3, wherein:
   the first pocket comprises a first window exposing the face of the first magnet;
   the second pocket comprises a second window exposing the face of the second magnet; and
   the first alignment surfaces are contactable with the second alignment surfaces to maintain a space between the exposed face of the first magnet and the exposed face of the second magnet.

5. The apparatus of claim 1, wherein the first alignment surfaces comprise first slanted surfaces located on opposite sides of the first magnet and the second alignment surfaces comprise second slanted surfaces located on opposite sides of the second magnet.

6. The apparatus of claim 1, wherein the lid is movable between a plurality of telescoping positions relative to the receptacle in the movement direction when the lid telescopically interacts with the receptacle.

7. The apparatus of claim 6, wherein:
the first structure comprises a first locking portion;
the second structure comprises a second locking portion; and
the second locking portion is operable with the first locking portion to lock the lid onto the receptacle in different fixed positions within the plurality of telescoping positions.

8. The apparatus of claim 7, wherein:
the first locking portion comprises a plurality of teeth separated by a plurality of spaces; and
the second locking portion comprises a lever insertable into the plurality of spaces to lock the lid onto the receptacle in one fixed position of the different fixed positions within the plurality of telescoping positions.

9. The apparatus of claim 1, wherein:
the receptacle defines an outer perimeter receivable in an opening of a surface; and
the frame of the lid comprises:
an inner frame defining an inner perimeter of the lid and comprising the second structure, the end wall, the plurality of ties attaching the end wall to the frame; and
an external shell defining an external perimeter of the lid and being removably attached to the inner frame by a plurality of frangible links.

10. The apparatus of claim 9, wherein the external perimeter of the lid is larger and laterally offset from the inner perimeter of the lid to define a back surface of the external shell that at least partially covers a transitional zone defined between the opening of the surface and the outer perimeter of the receptacle when the receptacle is received in the opening and the lid is interlocked with the receptacle.

11. The apparatus of claim 9, wherein:
the inner perimeter of the inner frame of the lid comprises a first quadrilateral shape; and
a perimeter defined by the end wall comprises a second quadrilateral shape that coplanar with and spaced apart from the first quadrilateral shape.

12. A method comprising:
telescopically interacting the lid of the apparatus of claim 1 with the receptacle by contacting the first alignment surfaces with the second alignment surfaces to (i) align the lid with the receptacle by restricting movements of the lid to the movement direction relative to the receptable and (ii) position the first magnet across from the second magnet in the direction transverse with the movement direction; and
interlocking the lid with the receptacle by moving the second alignment surfaces along the first alignment surfaces in the movement direction using the magnetic force between the first magnet and the second magnet.

13. The method of claim 12, wherein contacting the first alignment surfaces with the second alignment surfaces comprises receiving the first alignment surfaces in a recess defined by the second alignment surfaces.

14. The method of claim 12, wherein the lid is movable between a plurality of telescoping positions relative to the receptacle in the movement direction when the lid telescopically interacts with the receptacle; and the method further comprises:
locking the lid onto the receptacle into a fixed position within in the plurality of telescoping positions.

15. The method of claim 12, wherein the receptacle comprises a back wall and a plurality of openings extending through the back wall, and the method further comprises:
attaching the receptacle to a surface using one or more openings of the plurality of openings; and
attaching one or more electronic accessories to the back wall with one or more attachment elements using another one or more openings of the plurality of openings.

16. The method of claim 12, wherein the receptacle defines an outer perimeter receivable in an opening formed in a surface, and interlocking the lid with the receptacle comprises one of:
covering a transitional zone defined between the opening of the surface and the outer perimeter of the receptacle with a removable portion of the lid; and
removing the removable portion of the lid.

17. A kit comprising
an apparatus according to claim 1; and
one or more attachment elements for mounting electronic accessories in the receptacle; or
a locking mechanism engageable with the first structure and the second structure to lock the lid onto the receptacle a fixed position.

18. The apparatus of claim 1, wherein:
the first structure comprises a first leading edge, the first alignment surfaces extend away from the first leading edge, and the first magnet comprises a face extending away from the first leading ledge; and
the second structure comprises a second leading edge, the second alignment surfaces extend away from the second leading edge, and the second magnet comprises a face extending away from the second leading ledge.

19. The apparatus of claim 18, wherein the first magnet comprises an end adjacent the first leading edge and the second magnet comprises an end adjacent the second leading edge.

* * * * *